United States Patent
Miyakawa

(10) Patent No.: US 7,436,135 B2
(45) Date of Patent: Oct. 14, 2008

(54) METHOD FOR CONTROLLING STAGE APPARATUS

(75) Inventor: Takahiro Miyakawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 115 days.

(21) Appl. No.: 11/462,383

(22) Filed: Aug. 4, 2006

(65) Prior Publication Data

US 2007/0046221 A1    Mar. 1, 2007

(30) Foreign Application Priority Data

Aug. 29, 2005    (JP) ............... 2005-247663

(51) Int. Cl.
*H02P 1/00* (2006.01)
(52) U.S. Cl. ............... 318/135; 318/560; 318/562; 318/649
(58) Field of Classification Search ......... 318/254, 318/439, 560, 561, 471, 723, 727
See application file for complete search history.

(56) References Cited

U.S. PATENT DOCUMENTS

| | | | |
|---|---|---|---|
| 6,563,286 B2 * | 5/2003 | Seki et al. ............ 318/727 |
| 6,661,127 B2 * | 12/2003 | Frissen et al. ............ 310/12 |
| 6,987,335 B2 | 1/2006 | Korenaga | |
| 7,081,726 B2 * | 7/2006 | Abe et al. ............ 318/400.01 |
| 7,205,741 B2 * | 4/2007 | Simons et al. ............ 318/560 |
| 2002/0018314 A1 * | 2/2002 | Takano et al. ............ 360/75 |
| 2002/0163257 A1 * | 11/2002 | Tsuboi et al. ............ 310/12 |
| 2003/0227271 A1 * | 12/2003 | Shindo ............ 318/439 |
| 2005/0156473 A1 * | 7/2005 | Tosiya ............ 310/120 |
| 2005/0285550 A1 * | 12/2005 | Simons et al. ............ 318/135 |
| 2006/0202568 A1 * | 9/2006 | Korenaga ............ 310/12 |

FOREIGN PATENT DOCUMENTS

JP    2004-254489 A    9/2004

* cited by examiner

*Primary Examiner*—Paul Ip
(74) *Attorney, Agent, or Firm*—Canon U.S.A. Inc., IP Division

(57) ABSTRACT

At least one exemplary embodiment is directed to a control method for controlling a stage apparatus including a base and a stage, the base including first and second coil phases, the stage including a plurality of magnets. The control method includes a first energization step of rotating the stage to a stable angle by contemporaneously energizing a plurality of coils comprising the first coil phase and a second energization step of rotating the stage to a stable angle by sequentially energizing coils comprising the second coil phase one by one.

6 Claims, 15 Drawing Sheets

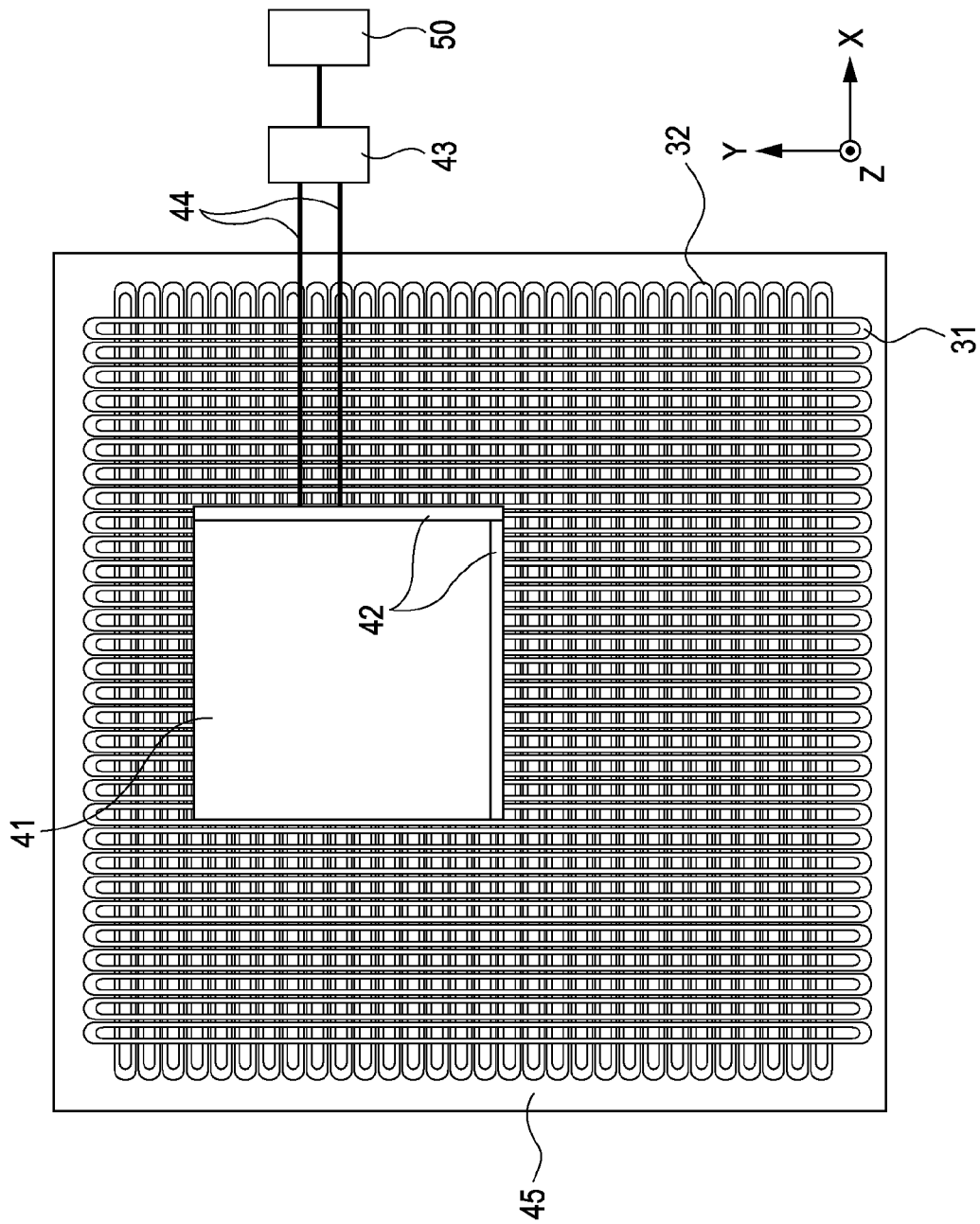

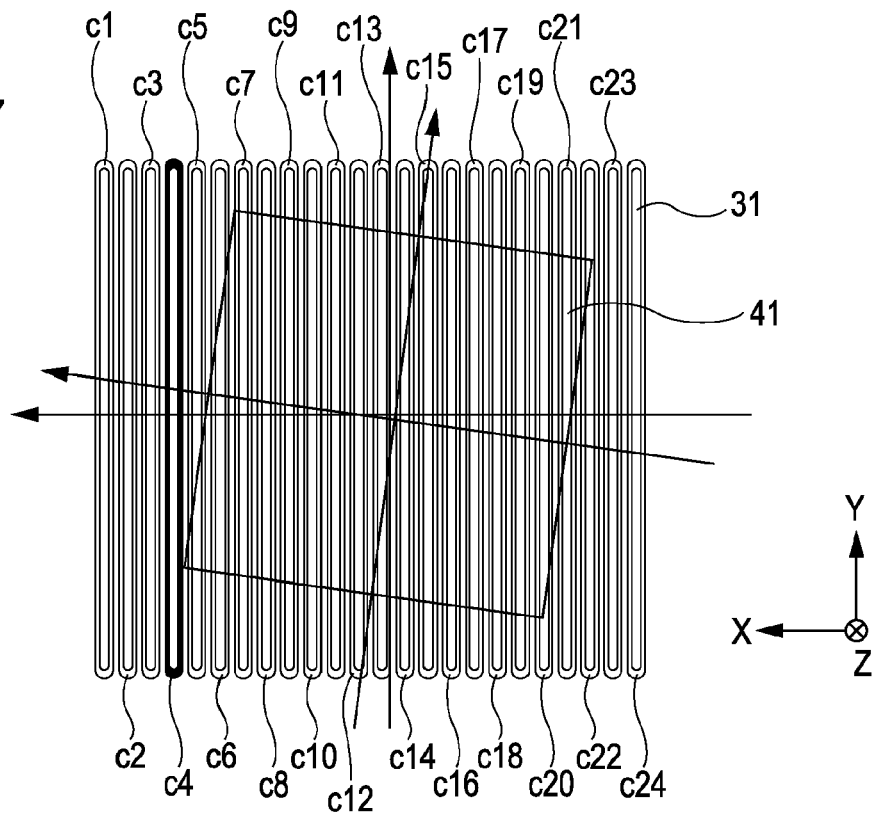
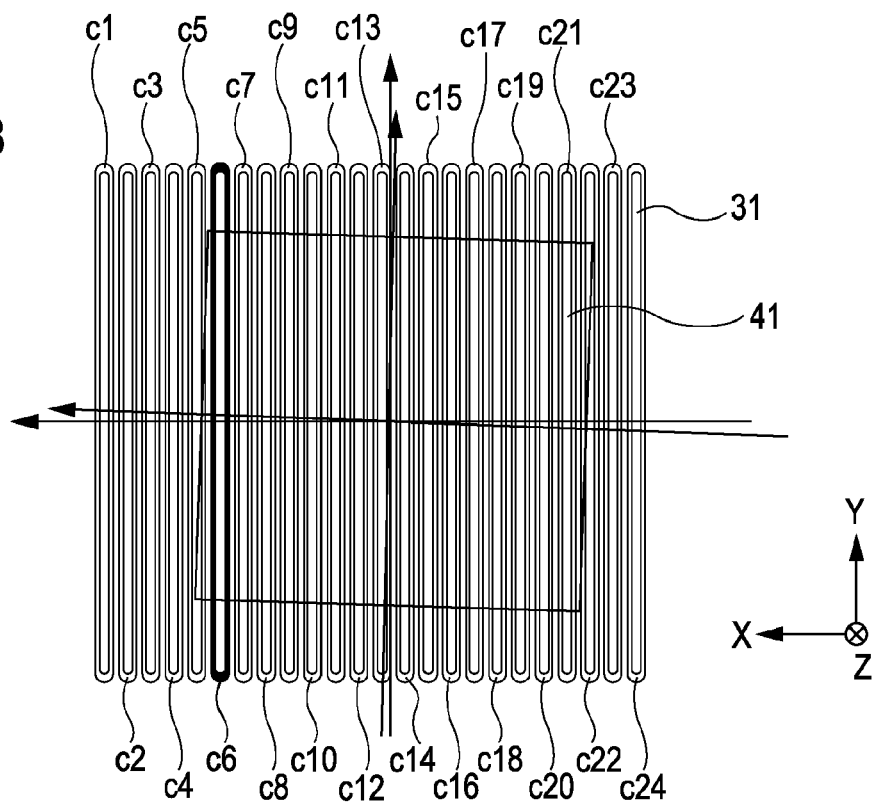

METHOD FOR CONTROLLING STAGE APPARATUS

BACKGROUND OF THE INVENTION

1. Field of the Invention

The present invention relates to a method for controlling a stage apparatus, and more specifically, though not exclusively, controlling a stage apparatus by using a planar motor.

2. Description of the Related Art

An exposure apparatus includes a wafer stage for facilitating the placement of a wafer thereon and to move the wafer. To drive such a stage, the use of a planar motor has received attention in recent years. FIGS. 1, 2A, and 2B illustrate a wafer stage using a planar motor as discussed in U.S. Pat. No. 6,987,335 (corresponding to Japanese Patent Laid-Open No. 2004-254489).

In FIGS. 2A and 2B, a plurality of magnets are disposed on a lower surface of a stage (movable element), and a plurality of coils are disposed on a base (stator). The stage is moved with respect to the base by the Lorentz force generated by energizing the coils through which magnetic flux generated by the magnets passes.

A mirror is disposed on the stage, and the position of the stage is measured by causing measurement light emitted from an interferometer disposed outside the stage to be reflected by the mirror.

The stage apparatus using the planar motor described above has no guide. Therefore, in the case where a positional servo for the stage becomes inoperative, for example, when power is turned on in the apparatus, power fails, or power is shut down due to an emergency, the stage can be stopped at any angle of rotation about an axis substantially orthogonal to the base. However, if the stage is in a largely rotated state, it is difficult to detect the position of the stage using the interferometer. This is because the optical path of light from the interferometer is changed by being reflected by the mirror largely tilted together with the stage and thus the light does not return to the interferometer.

If the position of the stage is not detected, the stage cannot be subjected to the positional servo. In this case, the rotation of the stage is required to be manually returned to a state at which the position of the stage is detectable. Automatic positional determination would be useful in terms of both maintenance and throughput.

SUMMARY OF THE INVENTION

The present invention is directed to a control method configured to control a stage apparatus including a base and a stage, the base including first and second coil phases, the stage including a plurality of magnets. The control method includes a first energization step of rotating the stage to a stable angle by simultaneously energizing a plurality of coils comprising the first coil phase and a second energization step of rotating the stage to a stable angle by sequentially energizing coils comprising the second coil phase one by one.

The present invention is directed to a method for, in a stage apparatus using a planar motor, facilitating the automatic return of a stage to a state at which a positional servo is available even when the positional servo becomes inoperative. Additionally, because an auxiliary unit (e.g., a robot hand) is not required, the pressure to upsize and complicate the apparatus can be reduced.

Further features of the present invention will become apparent from the following description of exemplary embodiments with reference to the attached drawings.

BRIEF DESCRIPTION OF THE DRAWINGS

FIG. 1 illustrates a stage apparatus using a planar motor.

FIG. 7 illustrates a state in which a coil c4 is energized.

FIG. 8 illustrates a state in which a coil c6 is energized.

DESCRIPTION OF THE EMBODIMENTS

Figure 2A:
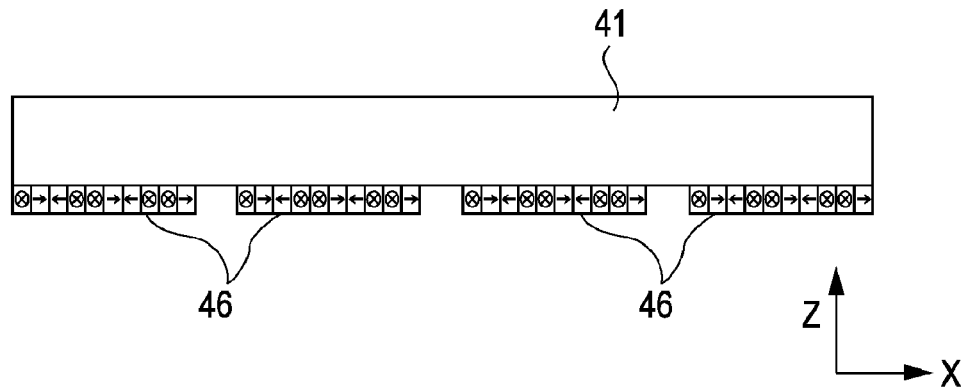
FIGS. 2A and 2B illustrate an arrangement of magnets disposed on a stage.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication of the coils.

In all of the examples illustrated and discussed herein any specific values, for example the number of coils, should be interpreted to be illustrative only and non limiting. Thus, other examples of the exemplary embodiments could have different values.

Notice that similar reference numerals and letters refer to similar items in the following figures, and thus once an item is defined in one figure, it may not be discussed for following figures.

Note that herein when referring to correcting or corrections of an error (e.g., a positional error), a reduction of the error and/or a correction of the error is intended.

First Exemplary Embodiment

A general structure of a planar motor is substantially disclosed in U.S. Pat. No. 6,987,335 (corresponding to Japanese Patent Laid-Open No. 2004-254489) and will only briefly described below with reference to FIGS. 1 and 2A and 2B.

A stage apparatus includes a stage (movable element) 41, a mirror 42 disposed on the stage 41a laser interferometer 43 disposed outside stage 41, and a base (stator) 45 supporting stage 41. On an upper surface of stage 41, a wafer chuck (not shown) is disposed, and the wafer chuck holds a wafer. On a lower surface (underside) of stage 41, a plurality of permanent magnets is disposed. The plurality of permanent magnets is arranged so as to form periodical distribution of magnetic flux density.

Figure 2B:
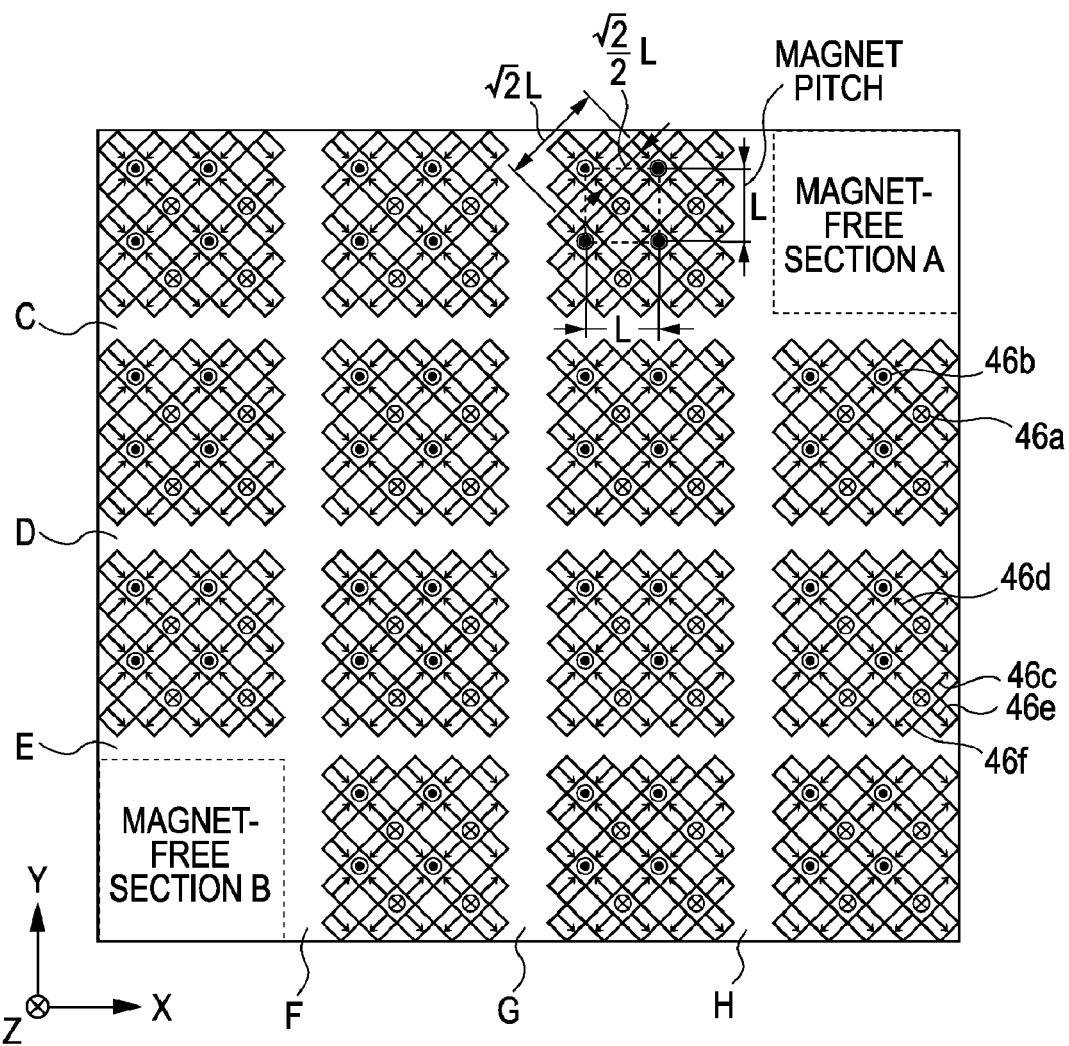

FIGS. 2A and 2B are illustrations for explaining the permanent magnets arranged on the lower surface of stage 41. FIG. 2A is a view as seen from the Y direction, and FIG. 2B is a view as seen from the −Z direction.

On the lower surface (underside) of stage 41, a magnet array 46 is arranged. The magnet array 46 includes the plurality of permanent magnets. Each of the permanent magnets is magnetized in a predetermined direction. Permanent magnets 46a are magnetized in the +Z direction, permanent magnets 46b are magnetized in the −Z direction, and permanent magnets 46c to 46f are magnetized in the horizontal direction, as illustrated in FIG. 2B.

These permanent magnets facilitate a magnetic flux distribution with a cycle of L to be formed with respect to the coils disposed on the base 45. On the underside of stage 41, magnet-free sections A and B and areas C to H have no permanent magnets disposed thereon. Stage 41 can be driven in the direction of rotation by the provision of the magnet-free sections A and B.

Base 45 is provided with a coil layer 31, and the coil layer 31 includes a plurality of coils aligned in the X direction. Each of the plurality of coils has a long straight-line segment extending in the Y direction. Stage 41 is driven in the X direction due to Lorentz force generated by passing currents through the coils of the coil layer 31. The currents passing through, the coils comprising the coil layer 31, are controlled by a controller (not shown).

For example in the coils, a current is supplied in units of a group of two adjacent coils. A two-phase linear motor can be constructed by passing sinusoidal currents whose phase difference is 90° through the two coils. The sinusoidal currents are determined on the basis of the relative positions of stage 41 and base 45.

For example, assuming that the magnetic flux density applied to a first coil (a) is represented by:

$$B_a(x) = B_z \cos(\omega x)$$

and the magnetic flux density applied to a second coil (b) is represented by:

$$B_b(x) = -B_z \sin(\omega x)$$

where ω is a constant determined by the magnet pitch, when the first coil receives a current represented by the following expression:

$$I_a(x) = I \cos(\omega x)$$

and the second coil receives a current represented by the following expression:

$$I_b(x) = -I \sin(\omega x),$$

the driving force fx(x) per unit length generated by the coils is calculated by the following expressions:

$$fx(x) = I_a(x)B_a(x) + I_b(x)B_b(x)$$

$$= IB_z(\cos^2(\omega x) + \sin^2(\omega x))$$

$$= IB_z$$

Therefore, a driving force having a constant magnitude is obtained independently of the position of stage 41 in the X direction. The same concept applies to driving forces in the Y and Z directions.

Below the coil layer 31, a coil layer 32 is disposed. The coil layer 32 includes a plurality of coils aligned in the Y direction. The structure of the coil layer 32 is substantially the same as that of the coil layer 31. Therefore, the explanation thereof is not repeated here. Below the coil layer 32, a plurality of coil layers can be disposed.

The mirror 42, which is disposed on stage 41, includes a reflection plane perpendicular to the X direction and a reflection plane perpendicular to the Y direction. The position of stage 41 in the X and Y directions are measured by causing a laser beam emitted from a laser interferometer to be reflected by each of the reflection planes. In FIG. 1, only the laser interferometer 43 for measuring the position of stage 41 in the X direction is shown. A mirror and an interferometer for measuring the position of stage 41 in the Z direction can be provided. The laser interferometer 43 irradiates the mirror 42 with two laser beams 44, thus enabling measurement of the amount of rotation of stage 41 about the Z axis.

The position of stage 41, measured by the laser interferometer and a target position, are input to the controller (not shown), and the position of stage 41 is subjected to servo control.

Stage 41 may have no guide, thus in the case where the servo for stage 41 becomes inoperative, for example, when power fails, or power is shut down due to an emergency, stage 41 may stop in a markedly rotated state. In this case, a laser beam reflected from the mirror 42 does not return to the laser interferometer, so that it becomes difficult to control stage 41.

To address this, the rotation of stage 41 is returned to a normal state (the rotation is initialized) by performing the control described below.

Figure 3:
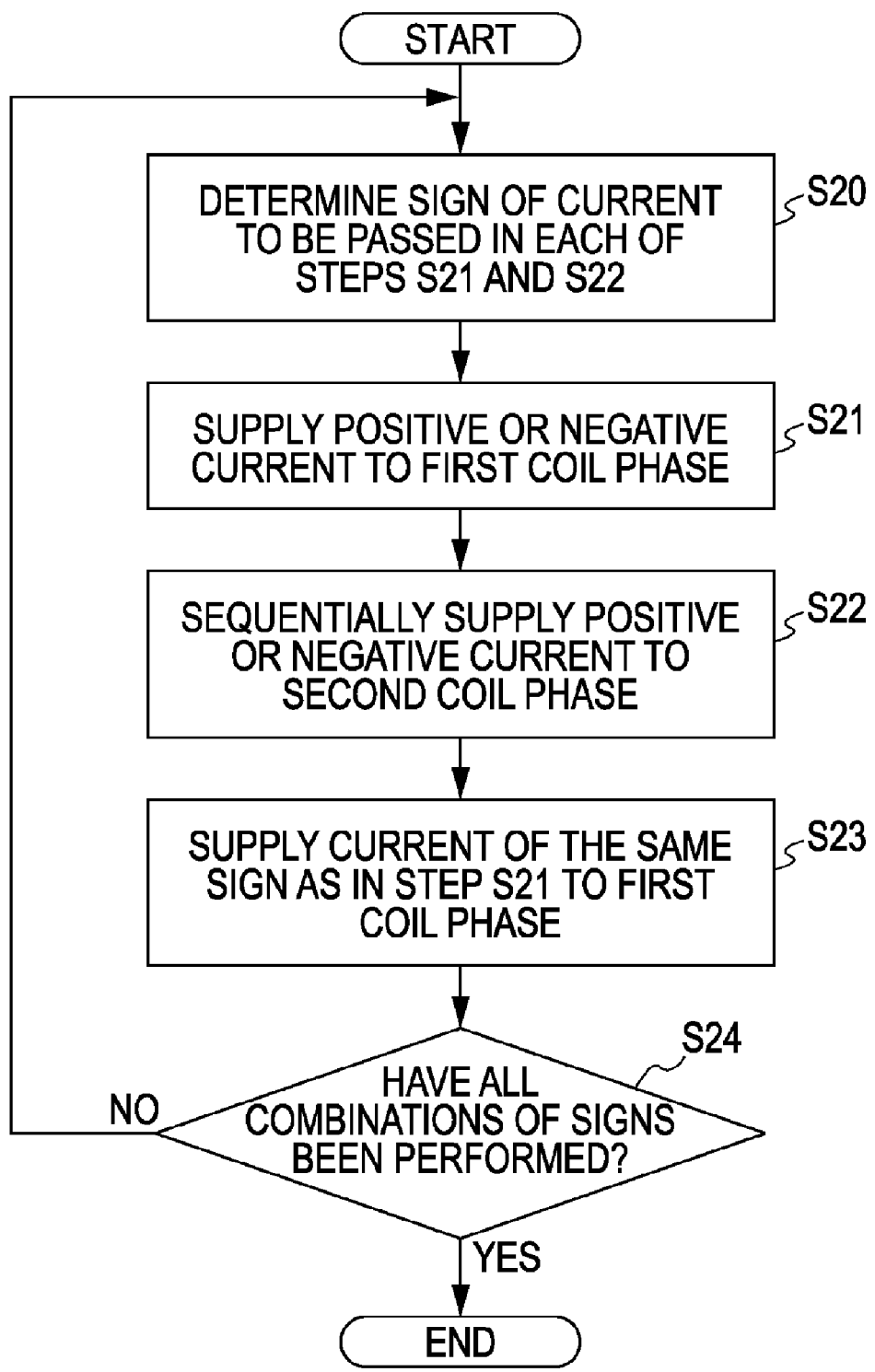
FIG. 3 is a flowchart of a control method according to an exemplary embodiment of the present invention.
Figure 5:
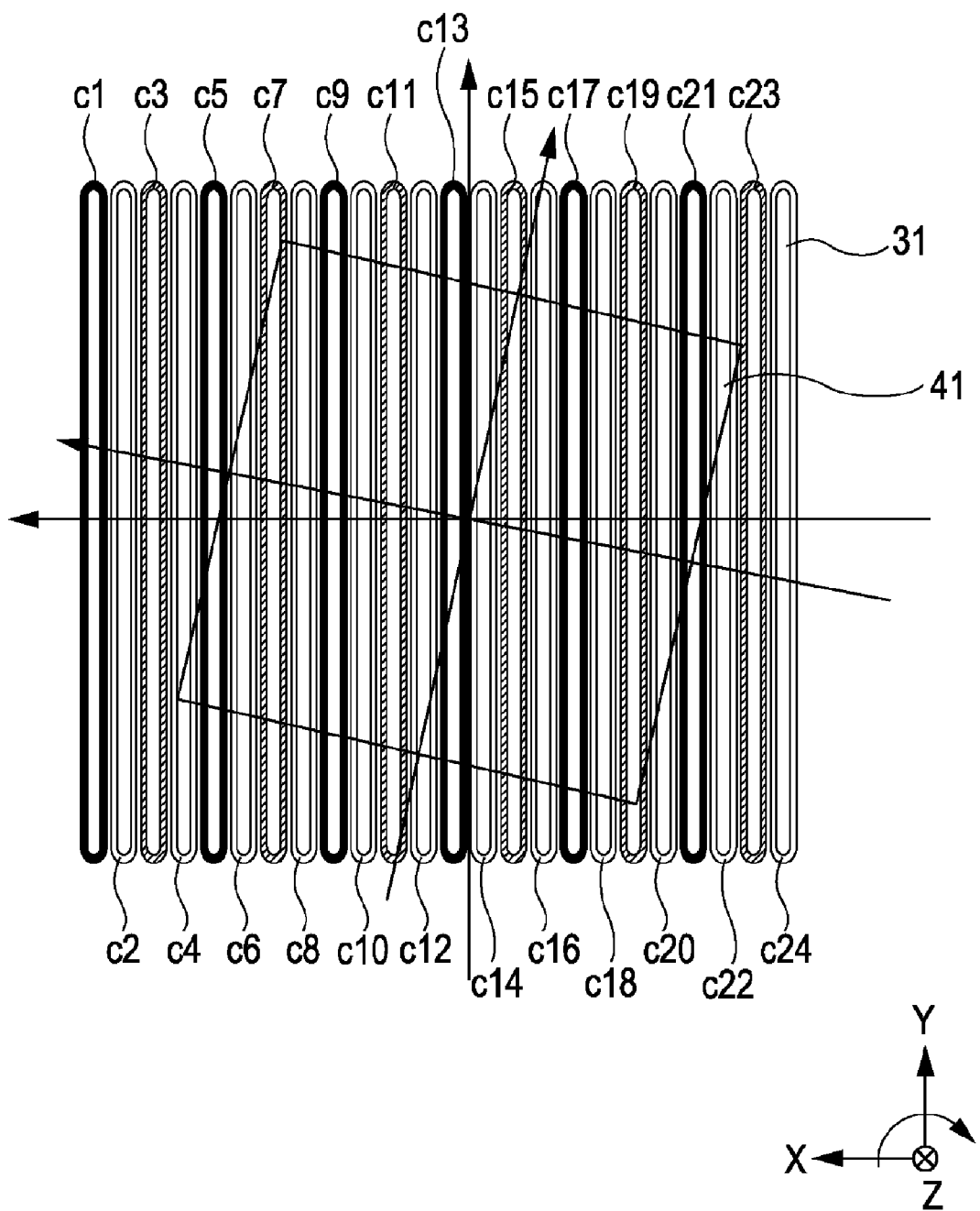
FIG. 5 is an illustration for explaining step S21 shown in FIG. 3.

FIG. 3 is a flowchart of a method for initializing the rotation of the stage. FIG. 5 illustrates a status in which stage 41 is difficult to control when stage 41 is in a rotated state in the X and Y directions. In FIG. 5, for the sake of clarity, only the coil layer 31 is illustrated. To initialize the rotation, the direction (sign) of a current to be supplied is first determined (step S20). The direction of a current to be supplied to a coil unit A (coils c1, c5, c9, c13, . . . ) is opposite to the direction of a current to be supplied to a coil unit B (coils c3, c7, c11, c15, . . . ). Then, the determined currents are passed (e.g., contemporaneously) through the coil unit A and coil unit B for a fixed period of time (step S21). The magnitude of a current supplied to each coil can have any value as long as stage 41 is rotated by the passage of current through the coil. In this exemplary embodiment, a two-phase coil is used, and the coil unit A and the coil unit B are the same coil phase. In other exemplary embodiments, multi-phase coils can be used.

At this time, if the position of stage 41 on base 45 is detectable by an image pickup apparatus or another known apparatus, only coils disposed at a portion where stage 41 is located may be energized.

Figure 6:
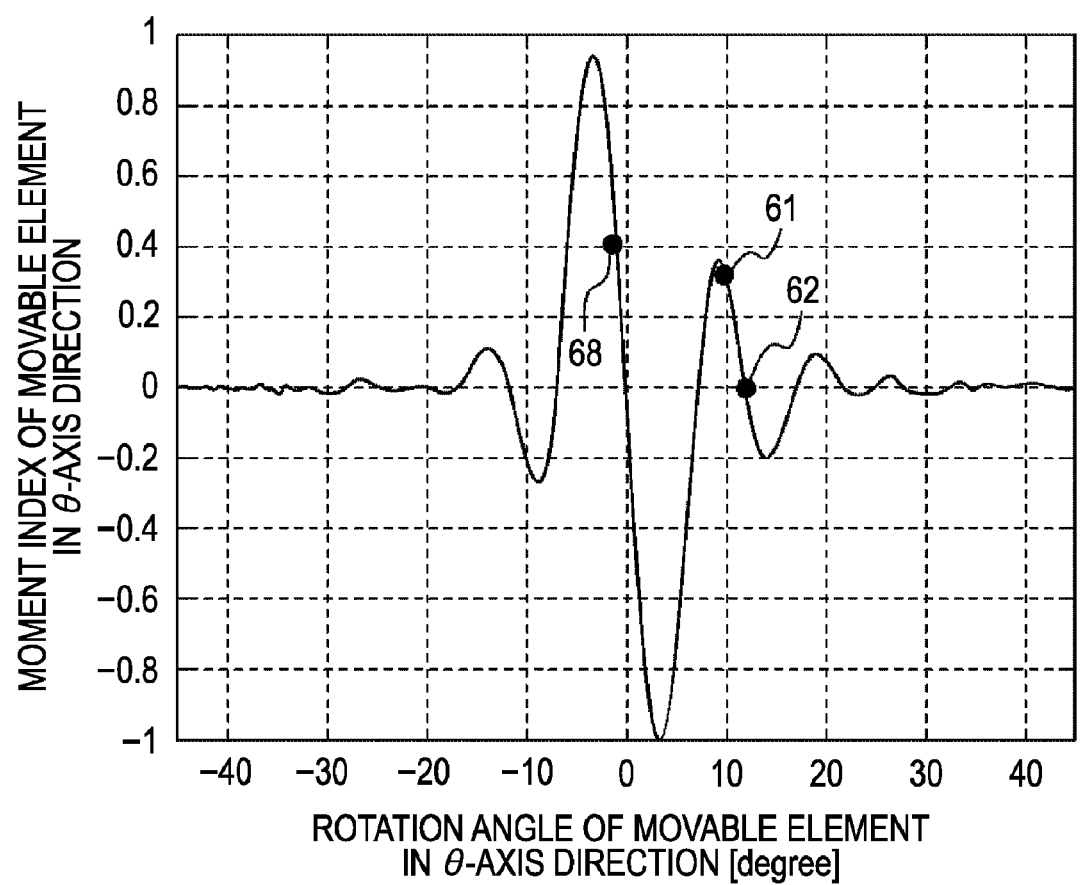
FIG. 6 illustrates a moment index in a $\theta$-axis direction with respect to a rotation angle of the stage in step S21 shown in FIG. 3.

Processing of step S21 causes stage 41 to be captured by Lorentz force acting between the magnets and the coils, and stage 41 stops in a state in which stage 41 has been rotated about the Z direction. FIG. 6 is a graph showing the relationship between the rotation angle of stage 41 and the moment on stage 41 at this time. The vertical axis of the graph of FIG. 6 is normalized so that the maximum value of the moment on stage 41 in a θz direction is one, where the magnitude of a current passing through a coil is one. For example, if it is assumed that the rotation angle of stage 41 immediately before step S21 is 10° (P61), the processing of step S21 produces a positive moment on stage 41. When stage 41 is subjected to the moment, stage 41 is rotated in a direction of increasing the rotation angle (the right-hand direction in the graph of FIG. 6) and stops at a rotation angle at which the magnitude of the moment is zero (referred to as a stable angle) (P62).

The constant current described above is sufficient to be supplied only for a period of time required to rotate and stop stage 41. This period of time can be measured in advance before the planar motor is incorporated in the apparatus. The same applies to the subsequent steps.

Subsequently, a constant current is sequentially supplied to the coils composing a coil phase that has not been energized in step S21 one by one such that the energization starts from a coil c2, which is end most in that coil phase (step S22). If the position of stage 41 on base 45 is detectable by an image pickup apparatus or another known apparatus, a constant current can be sequentially supplied to the coils disposed at a portion where stage 41 is located such that the energization starts from a coil c4, which is the end-most coil in that portion. In other words, a current can be supplied to at least coils present opposite to a plurality of magnetic lines of force. An example of the latter method will be described below. FIGS. 7 to 10 illustrate statuses in which the associated coils are energized in step S22. FIGS. 11 to 14 illustrate the relationships between the rotation angle of stage 41 and the moment exerted on stage 41 occurring when the coils are energized as illustrated in FIGS. 7 to 10. The graphs of FIGS. 11 to 14 are normalized in the same way as in FIG. 6.

Figure 11:
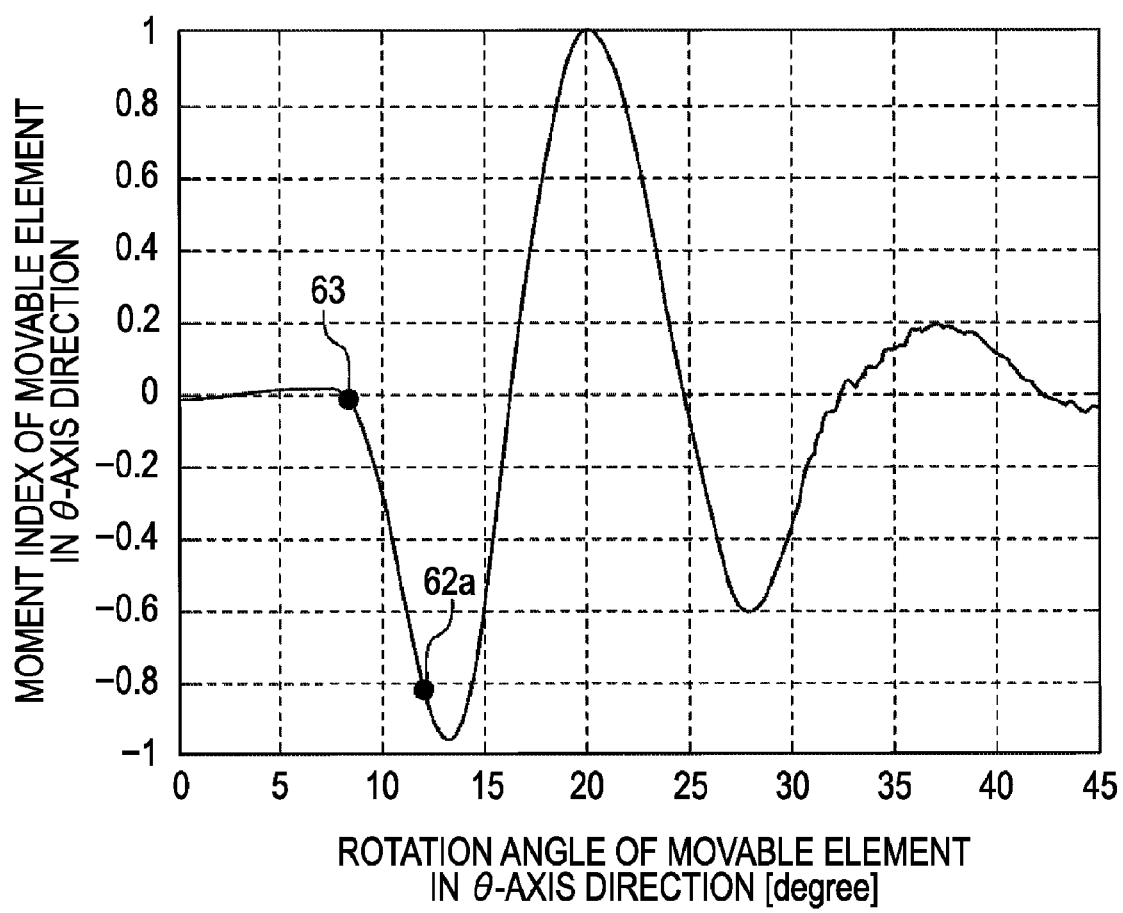
FIG. 11 illustrates the moment index in the $\theta$-axis direction with respect to the rotation angle of the stage when the coil c4 is energized.

FIG. 7 illustrates a status in which the coil c4 is energized. In this status, Lorentz force acts between the coil c4 and stage 41 (magnets), and stage 41 stops after stage 41 is rotated by the Lorentz force in the θ direction (about the z-axis). In FIG. 11, the rotation angle immediately before the coil c4 is energized is P62a in FIG. 11. When the coil c4 is energized, since the sign of the moment is negative, stage 41 is rotated in a direction of reducing the rotation angle (the left-hand direction in FIG. 11). Stage 41 stops at a rotation angle at which the magnitude of the moment is zero (P63).

Figure 12:
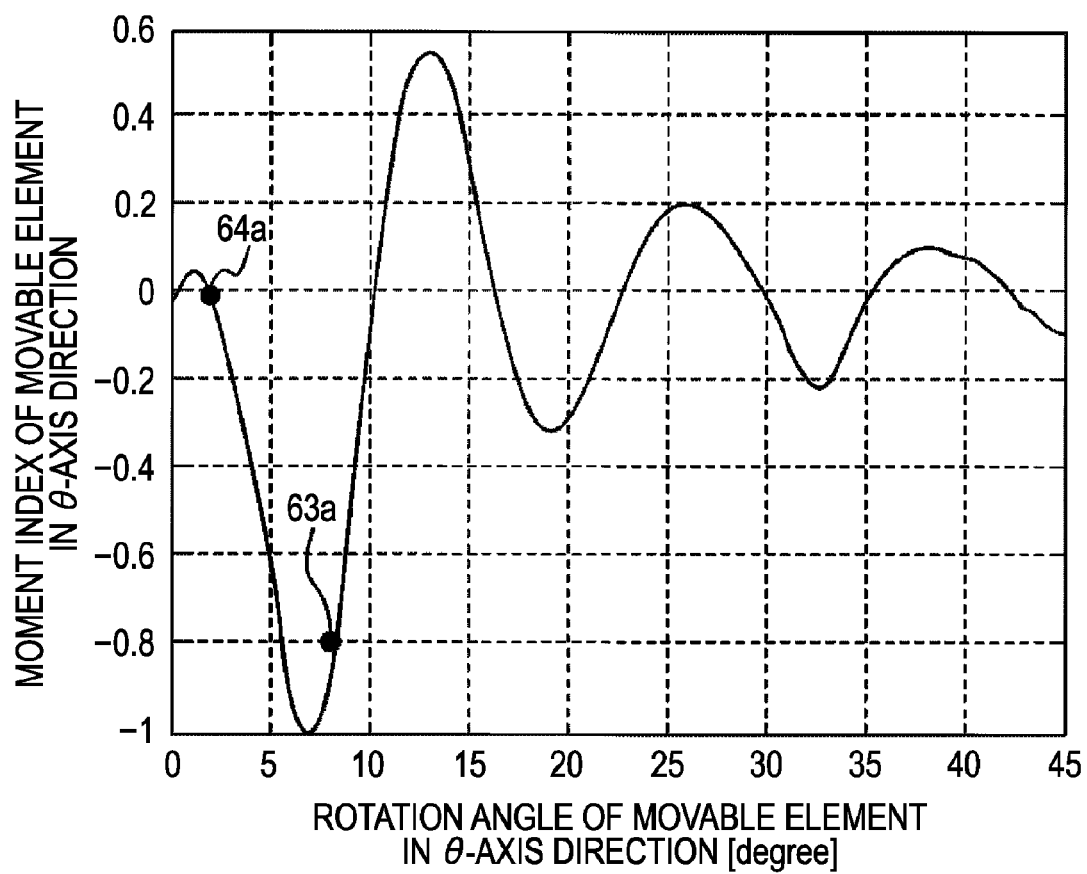
FIG. 12 illustrates the moment index in the $\theta$-axis direction with respect to the rotation angle of the stage when the coil c6 is energized.

Subsequently, the coil c6 is energized. FIG. 8 illustrates a status in which the coil c6 is energized. In this status, Lorentz force acts between the coil c6 and stage 41 (magnets), and stage 41 stops after stage 41 is rotated by the Lorentz force in the θ direction. In FIG. 12, the rotation angle immediately before the coil c6 is energized is P63 in FIG. 11. When the coil c6 is energized, since the sign of the moment is negative, stage 41 is rotated in a direction of reducing the rotation angle (the left-hand direction in FIG. 12). Stage 41 stops at a rotation angle at which the magnitude of the moment is zero (P64a).

Figure 9:
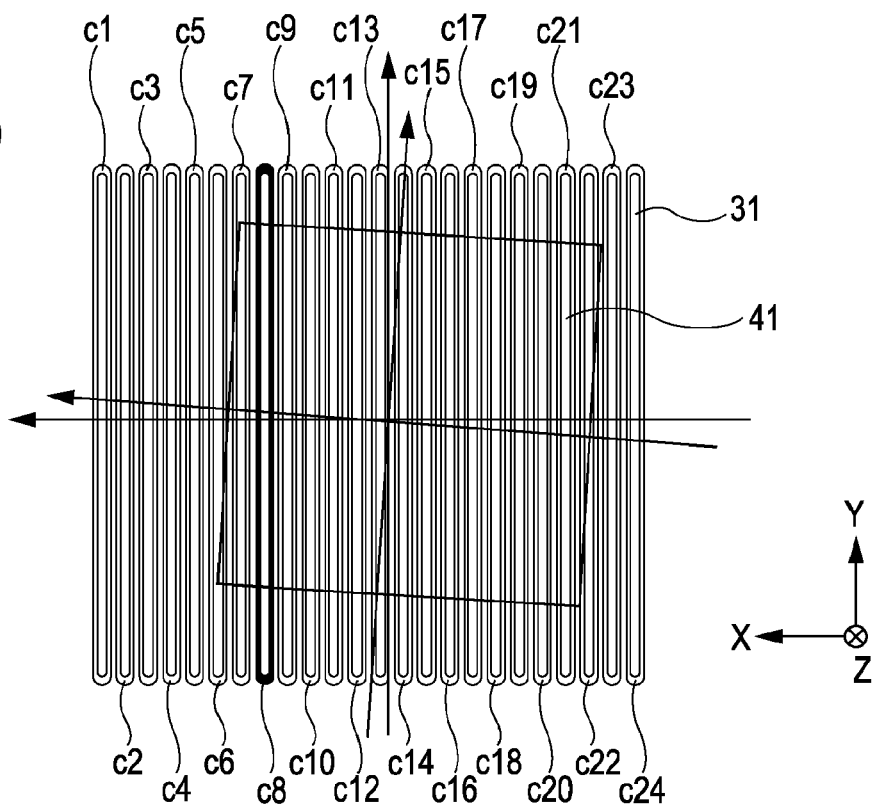
FIG. 9 illustrates a state in which a coil c8 is energized.
Figure 13:
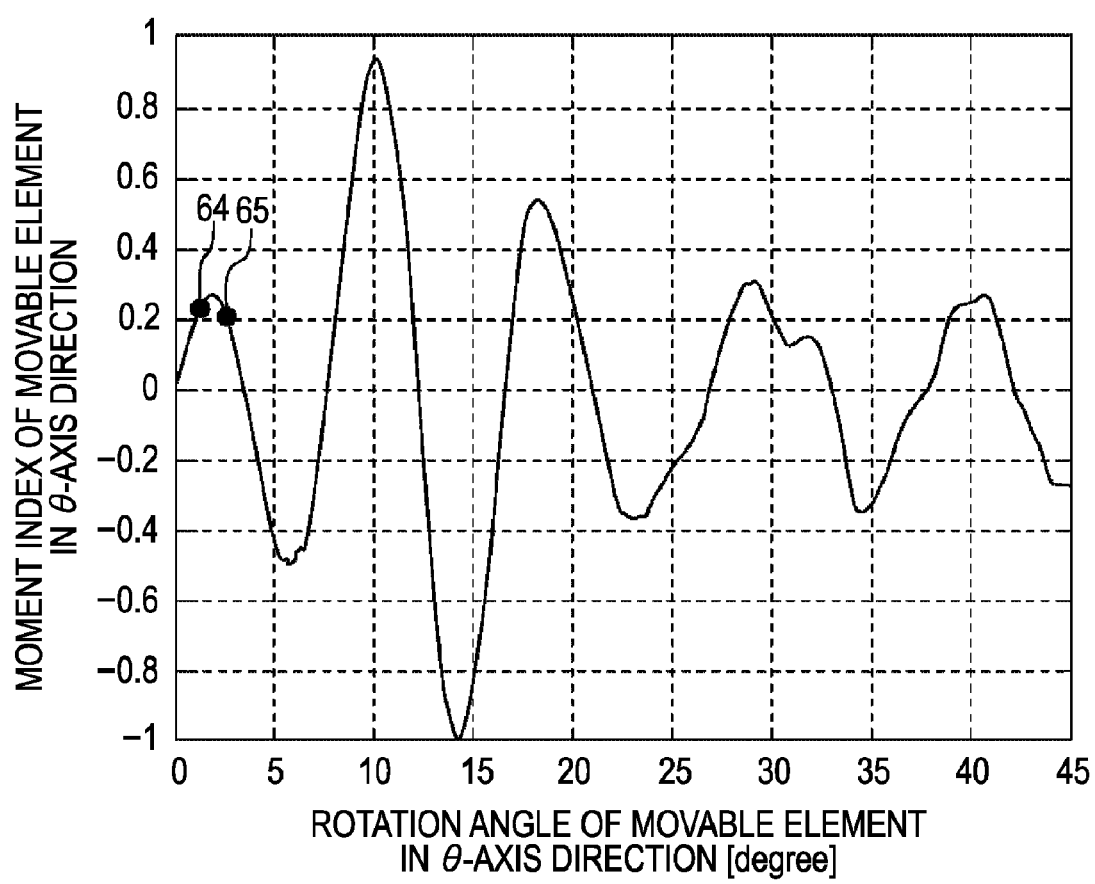
FIG. 13 illustrates the moment index in the $\theta$-axis direction with respect to the rotation angle of the stage when the coil c8 is energized.

Subsequently, the coil c8 is energized. FIG. 9 illustrates a status in which the coil c8 is energized. In this status, Lorentz force acts between the coil c8 and stage 41 (magnets), and stage 41 stops after stage 41 is rotated by the Lorentz force in the θ direction. In FIG. 13, the rotation angle immediately before the coil c8 is energized is P64 in FIG. 12. When the coil c8 is energized, since the sign of the moment is positive, stage 41 is rotated in a direction of increasing the rotation angle (the right-hand direction in FIG. 13). Stage 41 stops at a rotation angle at which the magnitude of the moment is zero (P65).

In step S22, the coils are sequentially energized in this way. For the sake of clarity, a coil that is energized lastly is described below.

Figure 10:
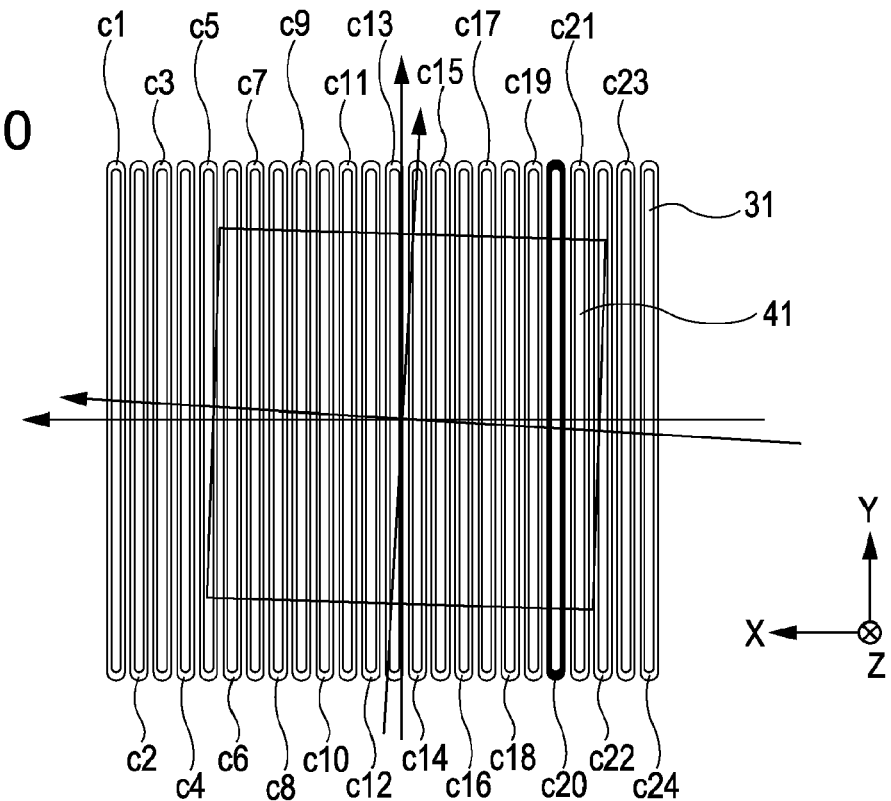
FIG. 10 illustrates a state in which a coil c20 is energized.
Figure 14:
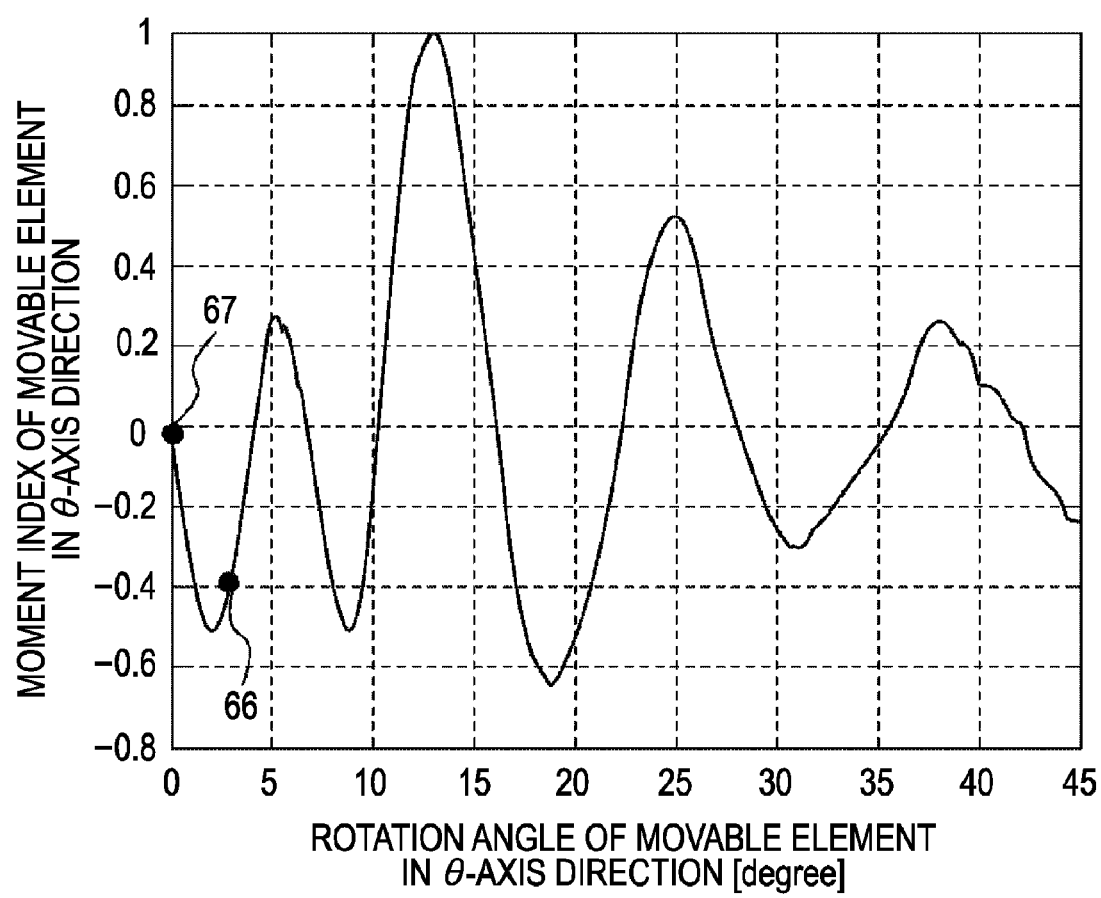
FIG. 14 illustrates the moment index in the $\theta$-axis direction with respect to the rotation angle of the stage when the coil c20 is energized.

In the foregoing example, the energization starts from the leftmost coil covered by stage 41 in the drawings, and the energization stops at the rightmost coil covered by stage 41 (e.g., coil c20). FIG. 10 illustrates a status in which the coil c20 is energized. In this status, Lorentz force acts between the coil c20 and stage 41 (magnets), and stage 41 stops after stage 41 is rotated by the Lorentz force in the θ direction. In FIG. 14, the rotation angle immediately before the coil c20 is energized is P66. When the coil c20 is energized, since the sign of the moment is negative, stage 41 is rotated in a direction of reducing the rotation angle (the left-hand direction in FIG. 14). Stage 41 stops at a rotation angle at which the magnitude of the moment is zero (P67).

The processing of step S22 is completed. In this way, the angle of stage 41 can be corrected. In the foregoing explanation, the rotation angle of stage 41 before the rotation is initialized is positive. In the case of a negative rotation angle, after the processing of step S22 is completed, it is found that the rotation angle of the stage is −2° (P68, FIG. 6). In this case, the same processing as step S21 is performed again (step S23).

Specifically, in step S23, current is supplied to the coil unit A (coils c1, c5, c9, c13, ... ), which is indicated by black in FIG. 5, and the coil unit B (coils c3, c7, c11, c15, ... ), which is hatched in FIG. 5, in mutually opposite directions only for a fixed period of time. As is apparent from FIG. 6, a positive moment occurs in stage 41. The positive moment rotates stage 41 in a direction of increasing the rotation angle (the right-hand direction in the Figure), and stage 41 stops when the rotation angle is zero (P67). In this state, the initialization of the rotation is completed.

In the exemplary embodiment described above, each of the currents in steps S21 and S22 has two possible signs, taking inversion into account. As a result, there are four combinations of the directions of currents in a series of processes of steps S21 to S23. When one combination among the four combinations is performed, stage 41 stops in a state in which the rotation angle in the θ direction is 0° after step S23 is completed. However, when any one of the other combinations is performed, stage 41 stops in a state in which stage 41 is positioned at a rotation angle in the θ direction after step S23 is completed. To reach the appropriate combination, the processes of steps S21 to S23 are repeated such that a different combination of the directions of the currents in steps S21 and S22 from the previous combination is selected. Therefore, even if it is difficult to detect the position and rotation of stage 41, the rotation of stage 41 can be initialized.

Figure 4:
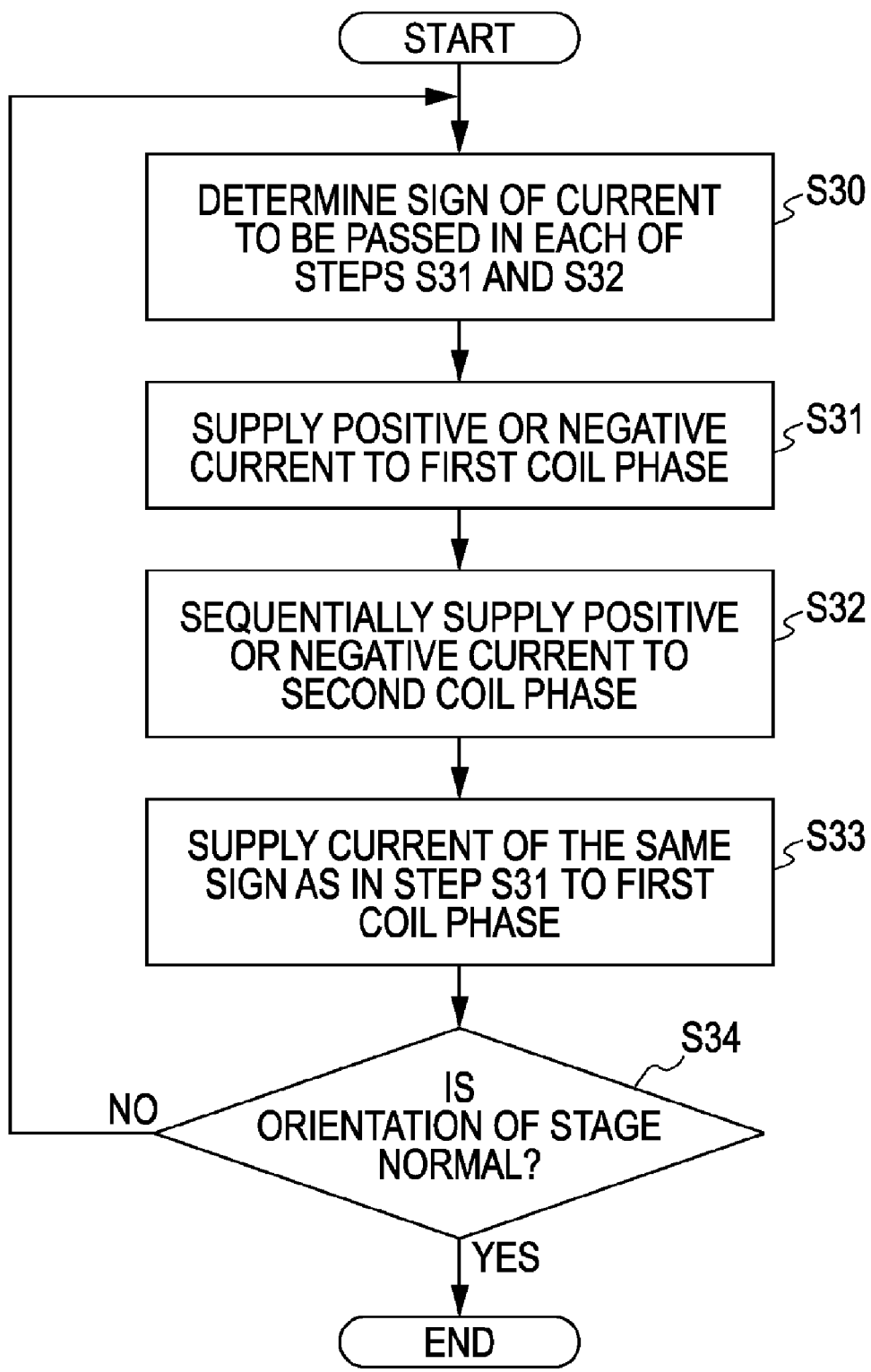
FIG. 4 is a flowchart of a control method according to a modification of the exemplary embodiment of the present invention.

FIG. 4 is a flowchart according to a modification of the exemplary embodiment. In this modification, a step of determining whether the rotation of stage 41 is normal or not (step S34) is added. Steps S30 to S33 are the same as steps S20 to S23. Therefore, the explanation thereof is not repeated here. To determine whether the rotation of stage 41 is normal or not, the laser interferometer 43 and a determining unit 50 in FIG. 1 can be used for example. If a beam from the laser interferometer 43 is reflected from the mirror 42 on stage 41 and then returns to the laser interferometer 43, the determining unit 50 determines that the rotation of stage 41 is normal. If the beam does not return, the determining unit 50 determines that the rotation of stage 41 is not normal. Alternatively, an image pickup apparatus (e.g., camera) can be used without the use of the laser interferometer 43.

If it is determined that stage 41 returns to a normal rotation before all four combinations are performed, it is not necessary to perform one or more combinations that remain unperformed. The determining unit can reduce the time required to initialize the rotation.

The two-phase linear motor used as the planar motor in the exemplary embodiment can be replaced with a linear motor including three or more phases.

According to the exemplary embodiment, even when the positional servo becomes inoperative, the stage can automatically return to a state in which the positional servo is available. Additionally, the tendency to increase the size of and/or complicate the apparatus is reduced because an auxiliary unit (e.g., a robot hand) is not employed.

Figure 15:
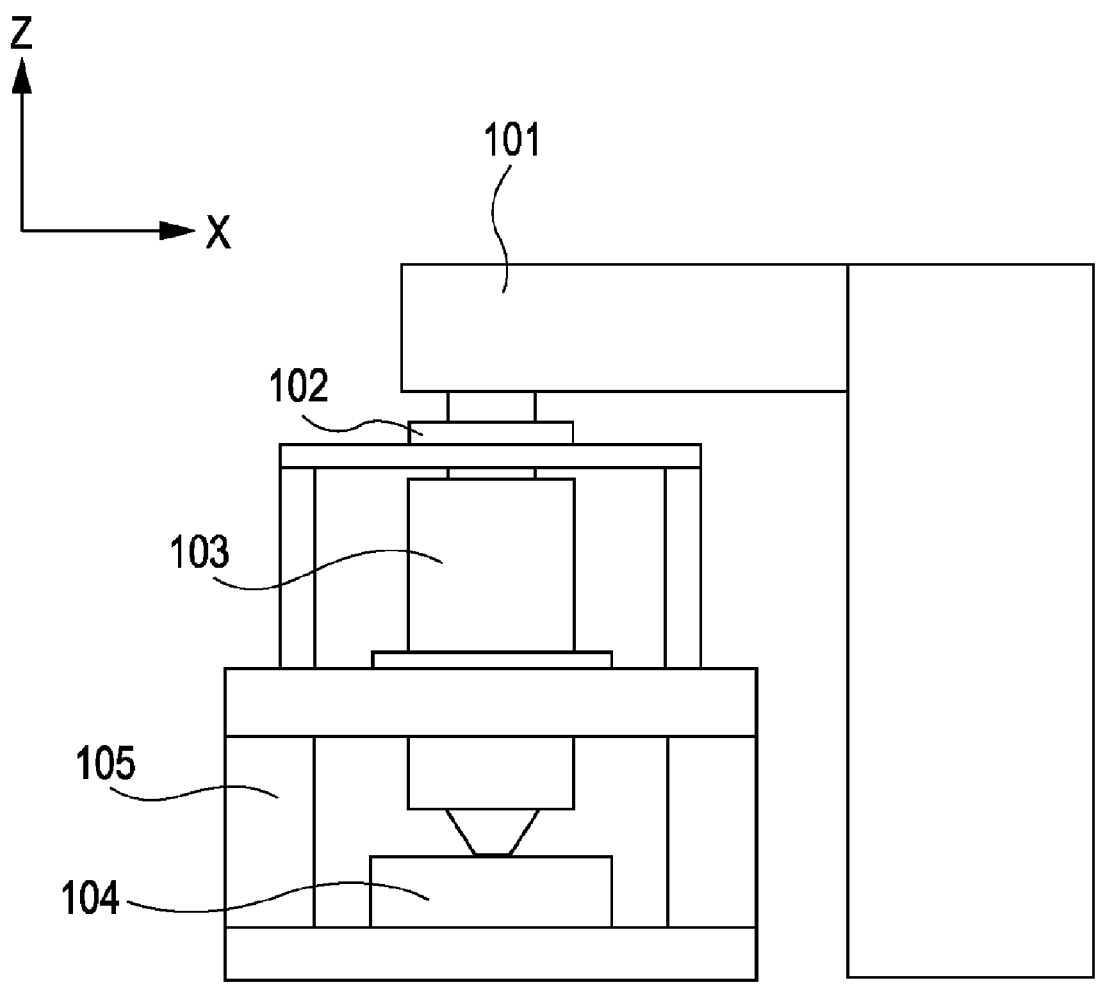
FIG. 15 illustrates an exposure apparatus.

An exemplary exposure apparatus using the stage apparatus according to the exemplary embodiment is described below. As shown in FIG. 15, the exposure apparatus includes an illumination apparatus 101, a reticle stage 102 on which a reticle is placed, a projection optical system 103, and a wafer stage 104 on which a wafer is placed. The exposure apparatus serves to project an image of a circuit pattern formed on a reticle onto the wafer and expose the wafer to transfer the circuit pattern to the wafer. Examples of a projection and exposure method used in the exposure apparatus include a step-and-repeat method and a step-and-scan method.

The illumination apparatus 101 illuminates the reticle on which a circuit pattern is formed and includes a light source unit and an illumination optical system. The light source unit may be a laser. Examples of the laser include an ArF excimer laser with a wavelength of approximately 193 nm, a KrF excimer laser with a wavelength of approximately 248 nm, and an F2 excimer laser with a wavelength of approximately 153 nm. However, the laser is not limited to an excimer laser. For example, the laser may be a YAG laser. The number of lasers is not limited to a specific number. When the light source is a laser, a beam shaping optical system for shaping a collimated light emitted beam from the laser light source into a desired beam form and an incoherence optical system for rendering a coherent laser beam incoherent can be used. The light source used in the light source unit is not limited to a laser. For example, one or more mercury lamps or xenon lamps can be used.

The illumination optical system in the illumination apparatus 101 is an optical system for illuminating a mask and includes a lens, a mirror, a light integrator, and a diaphragm.

Examples of the projection optical system 103 include an optical system comprising a plurality of lens elements, an optical system comprising a plurality of lens elements and at least one concave mirror (catadioptric optical system), an optical system including a plurality of lens elements and at least one diffractive optical element (e.g., kinoform), and an optical system including mirrors.

The wafer stage 104 is driven by the above-described planar motor. The reticle stage 102 can also be driven using the planar motor. Alternatively, a linear motor can be used. In the case of a step-and-scan projection and exposure method, the wafer stage 104 and the reticle stage 102 move in synchronization with each other. The wafer stage 104 can include two or more stages. The exposure apparatus can be an immersion exposure apparatus.

The exposure apparatus can be used in the manufacture of a device with a fine pattern, such as a semiconductor device (e.g., a semiconductor integrated circuit (IC) circuit), a micromachine, and a thin film magnetic head.

Figure 16:
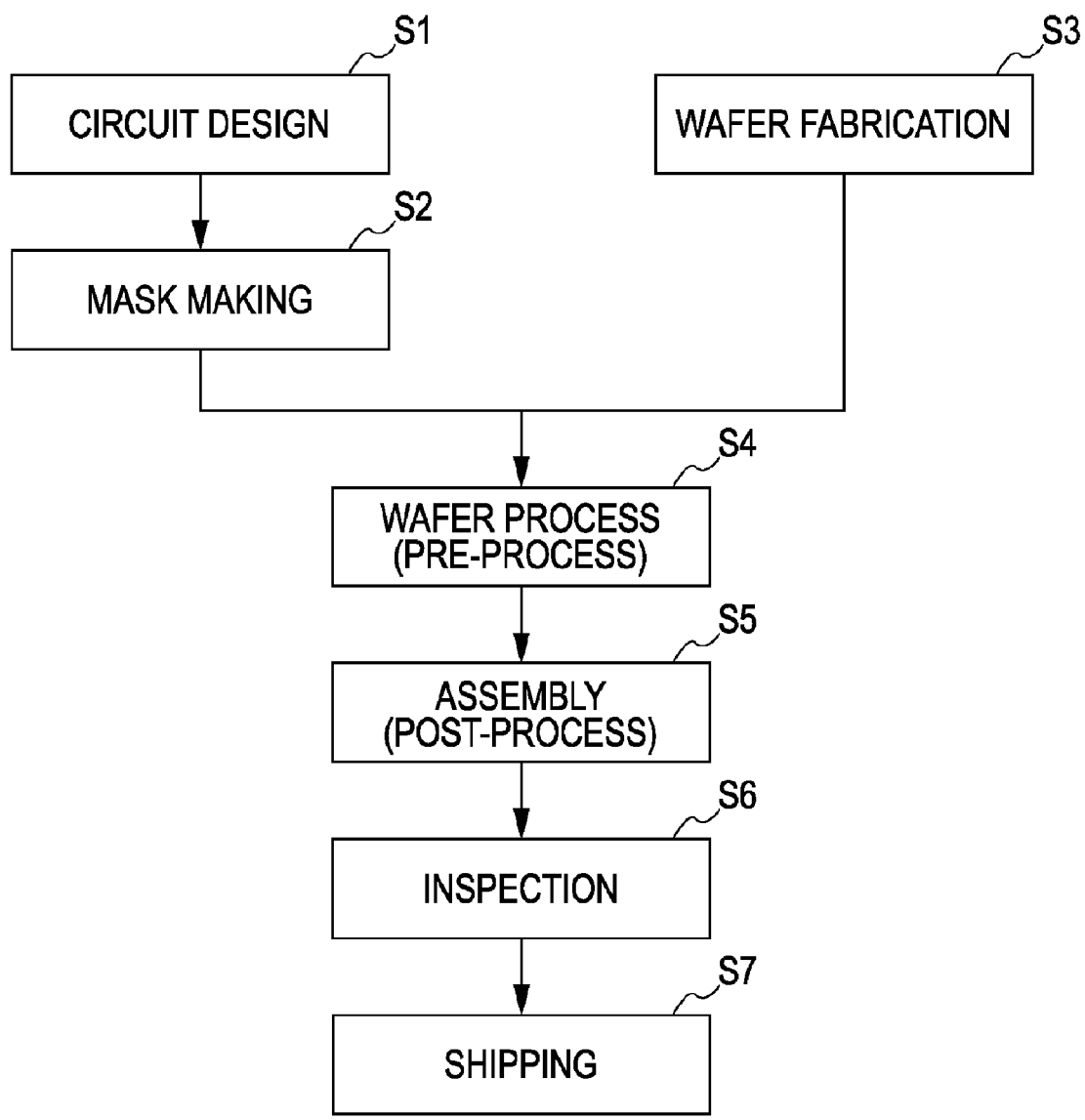
FIG. 16 is a flowchart of the steps for manufacture of a device using the exposure apparatus.

A method for manufacturing a device utilizing the exposure apparatus described above according to an exemplary embodiment is described below with reference to FIGS. 16 and 17. FIG. 16 is a flowchart for explaining exemplary manufacture of a device, such as a semiconductor chip (e.g., an IC chip and a large-scale integration (LSI) chip), a liquid crystal display (LCD), and a charge-coupled device (CCD). Here, the manufacture of a semiconductor chip is described as an example.

In step S1 (circuit design), a circuit for the semiconductor device is designed. In step S2 (mask making), a mask is made on the basis of the designed circuit pattern. In step S3 (wafer fabrication), a wafer is fabricated using a material such as silicon. In step S4 (wafer process), which is called a pre-process, an actual circuit is formed on the wafer by lithography utilizing the exposure apparatus using the mask and the wafer. Step S5 (assembly), which is called a post-process, is a step that produces the form of a semiconductor chip by using the wafer formed in step S4, and includes a assembly process including an assembly sub-process (dicing and bonding) and a packaging sub-process (chip encapsulation). In step S6 (inspection), inspections, such as an operation confirmation test and a durability test of the semiconductor device formed in step S5, are conducted. The manufacture of the semiconductor device is completed after these steps, and then the semiconductor device is shipped (step S7).

Figure 17:
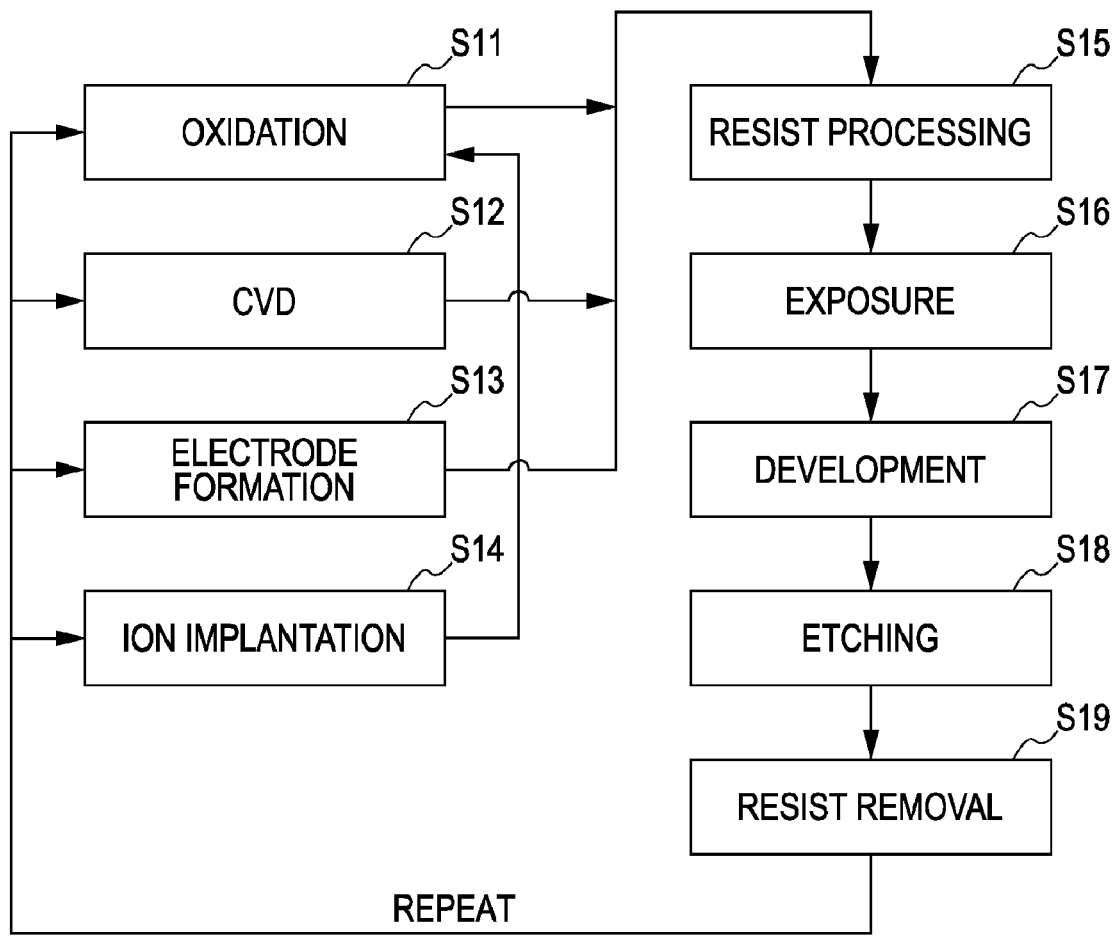
FIG. 17 is a detailed flowchart of a wafer process of step S4 shown in FIG. 16.

FIG. 17 is a flowchart that shows the details of the wafer process illustrated in step S4 of FIG. 16. In step S11 (oxidation), the wafer surface is oxidized. In step S12 (chemical-vapor deposition (CVD)), an insulating film is formed on the wafer surface. In step S13 (electrode formation), an electrode is formed on the wafer. In step S14 (ion implantation), ions are implanted in the wafer. In step S15 (resist processing), the wafer is coated with a photosensitive agent. In step S16 (exposure), the exposure apparatus described above exposes the wafer to transfer to the wafer the circuit pattern formed on the mask. In step S17 (development), the exposed wafer is developed. In step S18 (etching), an area where the developed resist image is absent is removed. In step S19 (resist removal), the resist, which is unnecessary after etching, has been removed. These steps are repeated to form multiple overlapping circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-247663 filed Aug. 29, 2005, which is hereby incorporated by reference herein in its entirety.

What is claimed is:

1. A control method for controlling a stage apparatus including a base and a stage, the base including first and second coil phases, the stage including a plurality of magnets, the control method comprising:
    a first energization step of rotating the stage to a stable angle by contemporaneously energizing coils comprising the first coil phase; and
    a second energization step of rotating the stage to a stable angle by sequentially energizing coils comprising the second coil phase one by one.

2. The control method according to claim 1, wherein, in each of the first and second energization steps, a constant current is supplied.

3. The control method according to claim 1, further comprising a third energization step of rotating the stage to a stable angle by contemporaneously energizing coils selected from the first coil phase after the second energization step.

4. The control method according to claim 1, further comprising a step of determining whether the rotation of the stage is normal or not.

5. The control method according to claim 1, wherein the first coil phase includes a first coil unit and a second coil unit, and wherein, in the first energization step, a first current is supplied to the first coil unit and a second current is supplied to the second coil unit, the direction of the first current being opposite to the direction of the second current.

6. A control method for controlling a stage apparatus including a base and a stage, the base including first and second coil phases, the stage including a plurality of magnets, the control method comprising:

a first energization step of rotating the stage to a stable angle by contemporaneously energizing coils comprising the first coil phase;

a second energization step of rotating the stage to a stable angle by sequentially energizing coils comprising the second coil phase one by one;

a determining step of determining whether the orientation of the stage is normal; and a changing step of changing a direction of a current to supply in the first and second energization steps, when it is determined the orientation of the stage is not normal in the determining step.

* * * * *